(12) United States Patent
Han et al.

(10) Patent No.: US 7,662,314 B2
(45) Date of Patent: Feb. 16, 2010

(54) CONDUCTIVE ORGANIC/INORGANIC COMPOSITE COMPOSITION AND ORGANIC ELECTROLUMINESCENT DEVICE COMPRISING THE SAME

(75) Inventors: Eun-Sil Han, Yongin-si (KR); Tae-Woo Lee, Seoul (KR); Jong-Jin Park, Guri-si (KR); Sang-Yeol Kim, Gwacheon-si (KR); Yu-Jin Kim, Suwon-si (KR); Lyong-Sun Pu, Suwon-si (KR); Young-Kwan Lee, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 493 days.

(21) Appl. No.: 11/348,337

(22) Filed: Feb. 7, 2006

(65) Prior Publication Data

US 2006/0175964 A1    Aug. 10, 2006

(30) Foreign Application Priority Data

Feb. 7, 2005    (KR)    ........... 10-2005-0011413

(51) Int. Cl.
*H01B 1/00* (2006.01)
*B32B 19/00* (2006.01)
*H01J 1/62* (2006.01)
*H01J 63/04* (2006.01)

(52) U.S. Cl. ............... 252/500; 428/690; 313/504; 313/506

(58) Field of Classification Search ............. 252/500; 313/504, 506; 428/690

See application file for complete search history.

(56) References Cited

U.S. PATENT DOCUMENTS 5,868,966 A * 2/1999 Wei et al. .......... 252/500
6,201,051 B1 * 3/2001 Mager et al. .......... 524/261

(Continued)

FOREIGN PATENT DOCUMENTS

CN    1575070    2/2005

OTHER PUBLICATIONS

Onoda et al., "Physical properties and application of conducting polypyrrole-silica glass composite films prepared by electrochemical polymerization," Synthetic Metals, 71, pp. 2255-2256 (1995).*

(Continued)

*Primary Examiner*—Mark Kopec
*Assistant Examiner*—Jaison P Thomas
(74) *Attorney, Agent, or Firm*—Robert E. Bushnell, Esq.

(57) ABSTRACT

A conductive organic/inorganic complex composition, a method of preparing the composition, a thin conductive organic/inorganic complex film prepared using the composition, an organic electroluminescent device comprising the thin conductive organic/inorganic complex film, and a method of manufacturing the organic electroluminescent device. The conductive organic/inorganic complex composition is prepared by mixing a mixed solution comprising a conductive polymeric monomer, an oxidizing agent, and an alcohol solvent with a silica sol solution comprising an organosilicon compound, water, an acid catalyst, and an alcohol solvent. According to the present invention, the conductive organic/inorganic complex composition is hydrophobic and insoluble in water and an organic solvent, has a high mechanical strength, and is thermally and chemically stable. Further, a compositional composition of the conductive organic/inorganic complex composition can be changed over a wide range.

21 Claims, 3 Drawing Sheets

U.S. PATENT DOCUMENTS

| | | | | |
|---|---|---|---|---|
| 6,368,715 | B1* | 4/2002 | Willems et al. | 428/428 |
| 6,404,120 | B1* | 6/2002 | Aben et al. | 313/479 |
| 6,696,104 | B2* | 2/2004 | Willems et al. | 427/385.5 |
| 2008/0175992 | A1* | 7/2008 | Plieth et al. | 427/212 |

OTHER PUBLICATIONS

Lee et al., "Transparent and Conductive Composite of Poly(3,4-Ethylenedioxythiophene) and Silica Sol-Gel Materials," Mol. and Liq. Cryst., vol. 337, pp. 213-216 (1997).*

Youngkwan Lee et al., "Transparent and Conductive Composite of Poly (3, 4-Ethylenedioxythiophene) and Silica Sol-Gel Matherials", Mol. Cryst. and Liq. Cryst., 1999, vol, 337, pp. 213-216.

Office action from the Patent Office of the People's Republic of China issued in Applicant's corresponding Chinese Patent Application No. 2006100067223 dated Jul. 3, 2009.

Office action from the Patent Office of the People's Republic of China issued in Applicant's corresponding Chinese Patent Application No. 200610067223 dated Jul. 3, 2009.

Youngkwan Lee et al.,"Transparent and Conductive Composite of Poly (3,4-Ethylenedioxythiophene) and Silica Sol-Gel Materials", Mol. Cryst. and Liq. Cryst., 1999, vol. 337, pp. 213-216.

* cited by examiner

QUENCHING BY ANODE ELECTRODE

QUENCHING BY CONDUCTIVE POLYMER

CONDUCTIVE ORGANIC/INORGANIC COMPOSITE COMPOSITION AND ORGANIC ELECTROLUMINESCENT DEVICE COMPRISING THE SAME

CROSS-REFERENCE TO RELATED PATENT APPLICATIONS AND CLAIM OF PRIORITY

This application claims the benefit of Korean Patent Application No. 10-2005-0011413, filed on Feb. 7, 2005, in the Korean Intellectual Property Office, the disclosure of which is incorporated herein in its entirety by reference.

BACKGROUND OF THE INVENTION

1. Field of the Invention

The present invention relates to a conductive organic/inorganic complex composition, a method of preparing the composition, a thin conductive organic/inorganic complex film prepared using the composition, an organic electroluminescent device comprising the thin conductive organic/inorganic complex film, and a method of manufacturing the organic electroluminescent device. More particularly, the present invention relates to a conductive organic/inorganic complex composition which is hydrophobic and insoluble in water and an organic solvent, has a high mechanical strength, and is thermally and chemically stable, and of which compositional composition can be changed over a wide range, a method of preparing the composition, a thin conductive organic/inorganic complex film prepared using the composition, an organic electroluminescent device comprising the thin conductive organic/inorganic complex film, and a method of manufacturing the organic electroluminescent device.

2. Description of the Related Art

Organic electroluminescent devices are self-emissive display devices using a phenomenon that when electrical current is applied to a fluorescent or phosphorescent organic layer, electrons and holes are combined in the organic layer to emit light. Organic electroluminescent devices have advantages such as light weight, simple constitutional elements, easy fabrication process, and high image quality and color purity. Further, they can realize moving pictures perfectly and can be operated at low power consumption. Thus, vigorous research is being conducted on the organic electroluminescent devices.

In the above organic electroluminescent devices, the organic layer may be a single emission layer. However, in general, the organic layer is an organic multi layer comprising a hole injection layer (HIL), an electron transport layer (ETL), a hole transport layer (HTL), and an emission layer (EML), etc., in order to increase efficiency and decrease a driving voltage. Such a multi layer may generally include a hole-related layer, an electron-related layer, and an emission layer. FIG. 1 is a schematic cross-sectional view of a conventional organic electroluminescent device (in the case of using a low molecular weight emission layer). Referring to FIG. 1, the conventional organic electroluminescent device has a structure in which an anode 12 is layered on a substrate 11 and a hole injection layer 13 and a hole transport layer 14 as hole-related layers are sequentially layered on the anode 12, an emission layer 15 is layered on the hole transport layer 14, an electron transport layer 16 and an electron injection layer (EIL) 17 as electron-related layers are sequentially layered on the emission layer 15, and a cathode 18 is layered on the electron injection layer 17.

In the conventional organic electroluminescent device, $O_2$ diffusion occurs in an anode, for example, made of indium tin oxide (ITO) and the anode has a low work function of 4.7 to 4.8 and has a rough surface. In order to overcome these problems, a conductive polymer, for example, water-soluble polyaniline, polypyrrole, or polythiophene, for example, polyethylenedioxythiophene (PEDOT) was used in a hole injection layer or a buffer layer.

FIG. 2 is a schematic view illustrating quenching in an organic electroluminescent device which does not comprise a hole injection layer or a buffer layer. FIG. 3 is a schematic view illustrating quenching in an organic electroluminescent device which comprises a hole injection layer or a buffer layer 33.

Referring to FIG. 2, quenching occurs on an ITO electrode 22 in the device which does not comprise a hole injection layer or a buffer layer. Referring to FIG. 3, quenching occurs on the hole injection layer or buffer layer 33 containing a conductive polymer in the organic electroluminescent device which comprises the hole injection layer or buffer layer 33.

The device illustrated in FIG. 2 has a structure in which an emission layer 25 is directly coated on the ITO electrode 22 and has low performance of device due to the problems induced by ITO, as described above. In FIG. 2, reference numerals 28 and 29 denote a cathode and an emissive region, respectively. To overcome the problems, the device illustrated in FIG. 3, a conductive polymeric material, for example, polyaniline, polypyrrole, or PEDOT/PSS is used in the hole injection layer 33 formed on an ITO electrode 32. In FIG. 3, reference numerals 35, 38, and 39 denote an emission layer, a cathode, and an emissive region, respectively. However, the conductive polymeric material is hydrophilic, has a high water uptake, is highly soluble in water or an organic solvent, and binds to electron to form a salt and induce sulfate diffusion.

SUMMARY OF THE INVENTION

The present invention provides a conductive organic/inorganic complex composition which is hydrophobic and insoluble in water and an organic solvent after being formed into a thin film, has a high mechanical strength, and is thermally and chemically stable, and of which compositional composition can be changed over a wide range, a method of preparing the composition, a thin conductive organic/inorganic complex film prepared using the composition, an organic electroluminescent device comprising the thin conductive organic/inorganic complex film, and a method of manufacturing the organic electroluminescent device.

According to an aspect of the present invention, there is provided a conductive organic/inorganic complex composition prepared by mixing a mixed solution comprising a conductive polymeric monomer, an oxidizing agent, and an alcohol solvent with a silica sol solution comprising an organosilicon compound, water, an acid catalyst, and an alcohol solvent.

According to another aspect of the present invention, there is provided a method of preparing a conductive organic/inorganic complex composition, comprising: obtaining a silica sol solution by mixing an organosilicon compound, water, an acid catalyst, and an alcohol solvent; and mixing the silica sol solution with a mixed solution comprising a conductive polymeric monomer, an oxidizing agent, and an alcohol solvent.

According to still another aspect of the present invention, there is provided a thin conductive organic/inorganic complex film prepared by coating the conductive organic/inorganic complex composition and thermally polymerizing the coating.

According to yet another aspect of the present invention, there is provided an organic electroluminescent device comprising a thin conductive organic/inorganic complex film prepared by coating the conductive organic/inorganic complex composition and thermally polymerizing the coating.

According to a further another aspect of the present invention, there is provided a method of preparing an organic electroluminescent device, comprising: forming an anode on a substrate; forming a hole injection layer on the anode; forming a hole transport layer on the hole injection layer; forming an emission layer on the hole transport layer; and forming a cathode on the emission layer, wherein at least one selected from the group consisting of the anode, the hole injection layer, the hole transport layer, and the cathode comprises a thin conductive organic/inorganic complex film prepared by coating the conductive organic/inorganic complex composition and thermally polymerizing the coating.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
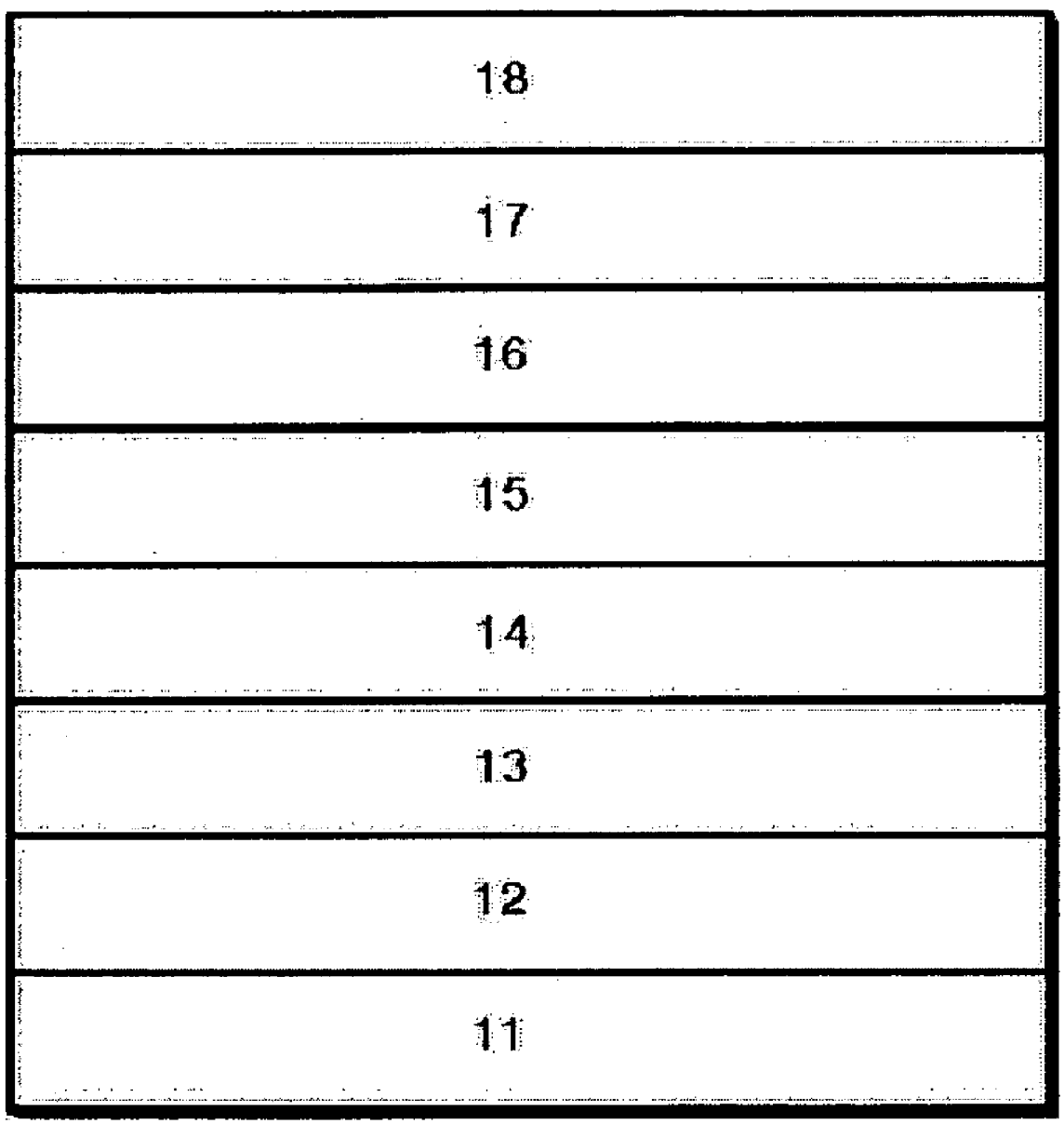
FIG. 1 is a schematic cross-sectional view of a conventional organic electroluminescent device.
Figure 2:
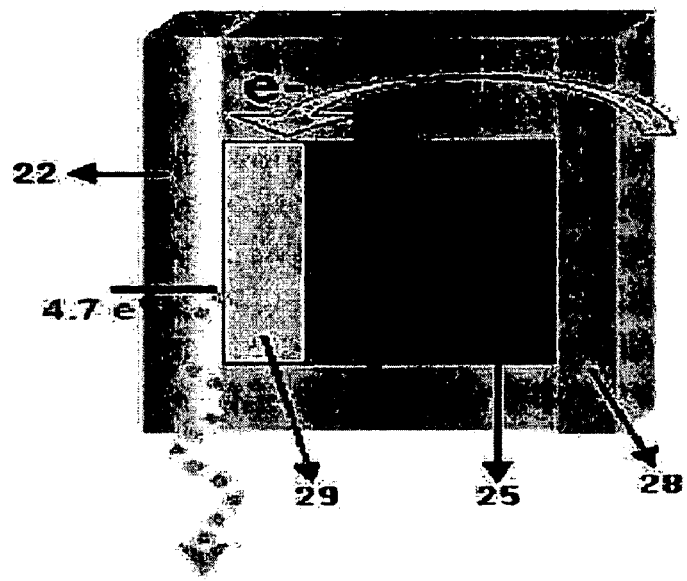
FIG. 2 is a schematic view illustrating quenching in an organic electroluminescent device which does not comprise a hole injection layer or a buffer layer.
Figure 3:
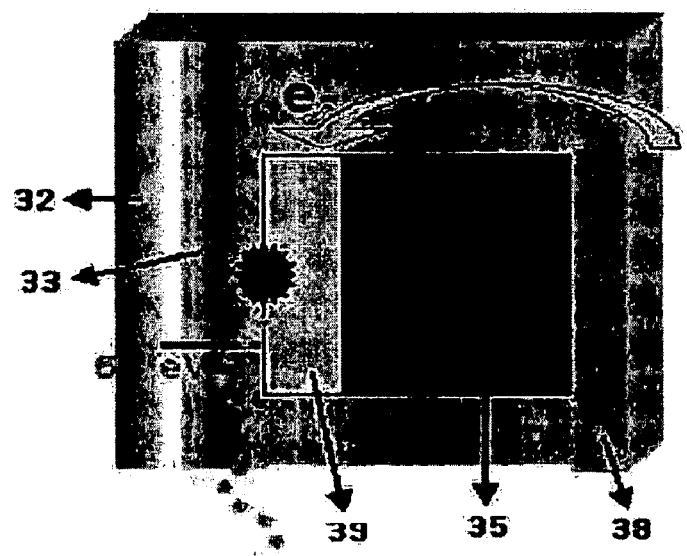
FIG. 3 is a schematic view illustrating quenching in an organic electroluminescent device which comprises a hole injection layer or a buffer layer.

Hereinafter, embodiments of the present invention will be described in more detail.

The present invention relates to a conductive organic/inorganic complex composition, a method of preparing the composition, a thin conductive organic/inorganic complex film prepared using the composition, an organic electroluminescent device comprising the thin conductive organic/inorganic complex film, and a method of manufacturing the organic electroluminescent device. More particularly, the present invention relates to a conductive organic/inorganic complex composition which is hydrophobic and insoluble in water and an organic solvent, has a high mechanical strength, and is thermally and chemically stable, and of which compositional composition can be changed over a wide range, a method of preparing the composition, a thin conductive organic/inorganic complex film prepared using the composition, an organic electroluminescent device comprising the thin conductive organic/inorganic complex film, and a method of manufacturing the organic electroluminescent device.

According to an embodiment of the present invention, there is provided a conductive organic/inorganic complex composition prepared by mixing a mixed solution comprising a conductive polymeric monomer, an oxidizing agent, and an alcohol solvent with a silica sol solution comprising an organosilicon compound, water, an acid catalyst, and an alcohol solvent.

The conductive polymeric monomer may include at least one compound selected from the group consisting of 3,4-ethylenedioxythiophen (EDOT), thiophen, aniline, pyrrole and a derivative thereof.

The oxidizing agent may include at least one compound selected from the group consisting of iron chloride ($FeCl_3$), iron perchlorate ($Fe(ClO_4)_3$), ferric toluenesulfonate, ferric dodecyl bezenesulfonate, ferric anthraquinone sulfonate, and ammonium persulfate.

The organosilicon compound may have formula 1:

$$SiR^1_x R^2_{4-x} \qquad (1)$$

Wherein $R^1$ radicals are each independently a hydrogen atom, a fluorine atom, aryl, vinyl, allyl, or an unsubstituted or fluorine-substituted linear or branched C1-4 alkyl, $R^2$ radicals are each independently acetoxy, hydroxy, or a linear or branched C1-4 alkoxy, and x is an integer from 0 to 2.

Examples of the organosilicon compound having formula 1 include, but are not limited to, tetraethyl orthosilicate (TEOS), methyl trimethoxy silane (MTMS), and dimethyi-dimethoxysilane (DMDMS).

The acid catalyst may include at least one compound selected from the group consisting of hydrochloric acid, sulfuric acid, nitric acid, phosphoric acid, hydrofluoric acid, formic acid, and acetic acid.

The alcohol may include at least one compound selected from the group consisting of n-butanol, isopropanol, ethanol, and methanol.

The conductive organic/inorganic complex composition may further comprise at least one oxidation stabilizer. The oxidation stabilizer may be selected from the group consisting of imidazole, dicyanohexylamine, and 1,8-diazabicyclo [5,4,0]undec-7-en (DBU). The oxidation stabilizer can control a polymerization speed or doping speed of the composition, thereby providing a thin film on a substrate using, for example, a spin coating method. If the oxidation stabilizer is not contained in the composition, the polymerization solution is unstable and the polymerization speed is too high, and thus a thin film cannot be easily formed.

In the conductive organic/inorganic complex composition, a molar ratio of the conductive polymeric monomer and the organosilicon compound may be 1:0.01 to 1:100, and preferably 1:0.1 to 1:50. If the molar ratio of the organosilicon compound to the conductive polymeric monomer in the composition is less than 0.01, a thin film formed using the composition cannot effectively function as a hole injection layer. If the molar ratio of the organosilicon compound to the conductive polymeric monomer in the composition is greater than 100, a thin film formed using the composition functions as an insulating layer, thereby increasing a driving voltage and decreasing a hole injection property.

In the conductive organic/inorganic complex composition, a molar ratio of the conductive polymeric monomer and the oxidizing agent may be 1:0.01 to 1:100, and preferably 1:0.1 to 1:5.

In the silica sol solution, the concentration of the water used in hydrolysis may be 0.5 to 100 mol, preferably 1 to 50 mol, per mol of silicon atom.

If the concentration of the water used in hydrolysis is less than 0.5 mole per mol of silicon atom, the hydrolysis and a condensation reaction cannot fully occur, thereby decreasing a mechanical property of a coating layer.

According to another embodiment of the present invention, there is provided is a method of preparing a conductive organic/inorganic complex composition, comprising: obtaining a silica sol solution by mixing an organosilicon compound, water, an acid catalyst, and an alcohol solvent; and mixing the silica sol solution with a mixed solution comprising a conductive polymeric monomer, an oxidizing agent, and an alcohol solvent.

In the present embodiment, the conductive organic/inorganic complex composition is prepared by first obtaining the silica sol solution and then mixing the obtained silica sol solution with the mixed solution comprising the conductive polymeric monomer, the oxidizing agent, and the alcohol solvent, since when the silica sol solution is first obtained, hydrolysis can fully occur and thus a uniform reaction can occur in the silica sol solution.

The silica sol solution may be obtained by reacting the organosilicon compound, the water, the acid catalyst, and the alcohol solvent at 0 to 100° C.

According to still another embodiment of the present invention, there is provided a thin conductive organic/inorganic complex film prepared by coating the above conductive organic/inorganic complex composition and thermally polymerizing the coating.

The thermal polymerization may be performed at 0 to 200° C.

The thin film formed by the thermal polymerization may have a conductivity of $10^{-10}$ to $10^5$ S/cm. When the thin film has a conductivity of $10^{-10}$ to $10^5$ S/cm, it can be used as a transparent electrode, an interlayer in organic electroluminescent devices, a conductive or semiconductive polymer layer in electronic components, such as electronic circuits or printed circuit boards, or as an anti-static coating or an electromagnetic protective layer, etc.

According to yet another embodiment of the present invention, there is provided an organic electroluminescent device comprising the thin conductive organic/inorganic complex film.

The organic electroluminescent device may be produced using a high molecular weight emission layer or a low molecular weight emission layer.

The organic electroluminescent device using the high molecular weight emission layer comprises an anode formed on a substrate, a hole injection layer formed on the anode, a hole transport layer formed on the hole injection layer, an emission layer formed on the hole transport layer, an electron transport layer (ETL) formed on the emission layer, an electron injection layer (EIL) formed on the electron transport layer (ETL), and a cathode formed on the electron injection layer (EIL).

In the organic electroluminescent device using the high molecular weight emission layer, at least one selected from the group consisting of the anode, the hole injection layer, the hole transport layer, the charge transport layer, the charge injection layer, and the cathode comprises the thin conductive organic/inorganic complex film.

In the organic electroluminescent device using the high molecular weight emission layer, the substrate is a conventional substrate used in an organic electroluminescent device and may be a glass substrate, which has excellent transparency, surface smoothness, easy handling, and excellent waterproofness, or a transparent plastic substrate.

When the organic electroluminescent device is a front emission type device, the anode formed on the substrate is a reflective metal layer. When the organic electroluminescent device is a rear emission type device, the anode can be made of a transparent and highly conductive material, such as ITO, IZO (indium zinc oxide), tin oxide ($SnO_2$), zinc oxide (ZnO), or a mixture thereof.

The hole injection layer may have a thickness of 300 to 1000 Å. If the thickness of the hole injection layer is less than 300 Å, a hole injection property is poor. If the thickness of the hole injection layer is greater than 1000 Å, a driving voltage increases, which is undesirable.

The hole transport layer may have a thickness of 300 to 1000 Å. If the thickness of the hole transport layer is less than 300 Å, a hole transport property is poor. If the thickness of the hole transport layer is greater than 1000 Å, a driving voltage increases, which is undesirable.

In the organic electroluminescent device using the high molecular weight emission layer, a phosphorescent material and a fluorescent material may be used in the emission layer.

An electron injection layer may be selectively formed on the emission layer. The electron injection layer may be made of any conventional material, for example, LiF, Li, Ba, or $BaF_2$/Ca.

A cathode may be formed on the emission layer (when the device does not comprise an electron injection layer) or on the electron injection layer (when the device comprises an electron injection layer).

The organic electroluminescent device using the low molecular weight emission layer comprises an anode formed on a substrate, a hole injection layer formed on the anode, a hole transport layer formed on the hole injection layer, an emission layer formed on the hole transport layer, an electron transport layer formed on the emission layer, an electron injection layer formed on the electron transport layer, and a cathode formed on the electron injection layer.

In the organic electroluminescent device using the low molecular weight emission layer, at least one selected from the group consisting of the anode, the hole injection layer, the hole transport layer, the charge transport layer, the charge injection layer, and the cathode comprises the thin conductive organic/inorganic complex film.

The organic electroluminescent device using the low molecular weight emission layer may use the same substrate and anode as the high molecular weight organic electroluminescent device.

The hole injection layer may have a thickness of 50 to 1500 Å. If the thickness of the hole injection layer is less than 50 Å, a hole injection property is poor. If the thickness of the hole injection layer is greater than 1500 Å, a driving voltage increases, which is undesirable.

The hole transport layer may have a thickness of 50 to 1500 Å. If the thickness of the hole transport layer is less than 50 Å, a hole transport property is poor. If the thickness of the hole transport layer is greater than 1500 Å, a driving voltage increases, which is undesirable.

In the organic electroluminescent device using the low molecular weight emission layer, a red light-emitting material in a red light region (R), a green light-emitting material in a green light region (G), and a blue light-emitting material in a blue light region are respectively patterned to obtain emission layers which correspond to pixel regions. Each of the light emitting materials may be a mixture of at least two host materials.

The emission layer may have a thickness of 100 to 800 Å, and preferably 300 to 400 Å. If the thickness of the emission layer is less than 100 Å, luminous efficiency and lifetime decrease. If the thickness of the emission layer is greater 800 Å, a driving voltage increases, which is undesirable.

In the organic electroluminescent device using the low molecular weight emission layer, the electron transport layer is formed on the emission layer. The electron transport layer may be made of any conventional material used in the art, for example, Alq3. The electron transport layer may have a thickness of 50 to 600 Å. If the thickness of the electron transport layer is less than 50 Å, the lifetime decreases. If the thickness of the electron transport layer is greater than 600 Å, a driving voltage increases, which is undesirable.

An electron injection layer may be selectively formed on the electron transport layer. The electron injection layer may be made of any conventional material, for example, LiF, NaCl, CsF, $Li_2O$, BaO, or Liq. The electron injection layer may have a thickness of 1 to 100 Å. If the thickness of the electron injection layer is less than 1 Å, the electron injection layer cannot efficiently function, and thus a driving voltage increases. If the thickness of the electron injection layer is greater than 100 Å, the electron injection layer functions as an insulating layer, and thus the driving voltage increases.

Next, a metal for forming a cathode, which is a second electrode, is formed on the electron transport layer (when the device does not comprise an electron injection layer) or the electron injection layer (when the device comprises an electron injection layer). The metal for the cathode may be lithium (Li), magnesium (Mg), aluminum (Al), aluminum-lithium (Al—Li), calcium (Ca), magnesium-indium (Mg—In), magnesium-silver (Mg—Ag), etc.

According to a further embodiment of the present invention, there is a method of preparing an organic electroluminescent device, comprising: forming an anode on a substrate; forming a hole injection layer on the anode; forming a hole transport layer on the hole injection layer; forming an emission layer on the hole transport layer; and forming a cathode on the emission layer, wherein at least one selected from the group consisting of the anode, the hole injection layer, the hole transport layer, and the cathode comprises the thin conductive organic/inorganic complex film.

First, a material for forming the anode, which is a first electrode, is coated on the substrate. An insulating layer (PDL) defining a pixel region may be formed on the anode.

Then, the hole injection layer, which is an organic layer, is coated on the resultant structure. The hole injection layer may be formed on the anode using a conventional method, for example, a vacuum thermal deposition method or a spin coating method.

Then, the hole transport layer may be optionally formed on the hole injection layer using a vacuum thermal deposition method or a spin coating method, etc. The emission layer may be formed on the hole injection layer (when the device does not comprise a hole transport layer) or on the hole transport layer (when the device comprises a hole transport layer). The emission layer may be formed using a conventional method, for example, vacuum deposition, inkjet printing, laser induced thermal imaging, photolithograph, etc.

Subsequently, an electron transport layer (which is not formed in an organic electroluminescent device using a high molecular weight emission layer) and an electron injection layer may be optionally formed on the emission layer using a vacuum thermal deposition method or a spin coating method. Then, a cathode, which is a second electrode, is formed by coating a metal on the resultant structure using a vacuum thermal deposition method, and then encapsulated.

The method of preparing the organic electroluminescent device may further comprise exposing the thin conductive organic/inorganic complex film to light with a wavelength of 100 to 1500 nm to decrease its conductivity. In the exposure to light, an effect of forming a pattern can be obtained due to a difference in the conductivity between the exposed portion and the unexposed portion.

Hereinafter, the present invention will be described in more detail with reference to the following examples. However, these examples are given for the purpose of illustration and are not intended to limit the scope of the invention.

EXAMPLE 1

An ITO glass substrate with a surface resistance of 15 $\Omega/cm^2$ (1600 Å) (available from Corning Corporation) was cut into a size of 50 mm×50 mm×0.7 mm and sonicated in isopropyl and pure water, respectively, for 5 minutes and cleaned with UV light and ozone, respectively, for 30 minutes.

0.5 g of tetraethyl orthosilicate (TEOS) which is an organosilicon compound, water, $HNO_3$ (pH 1.5) which is an acid catalyst, and 41.54 g of a mixture of isopropanol and n-butanol in a weight ratio of 1:3, which is an alcohol solvent (which is used not only for the silica sol solution but also for the mixed solution) were mixed together and reacted for 4 hours to obtain a silica sol solution (10% by weight of silicate). Then, 0.5 g of 3,4-ethylenedioxythiophen (EDOT) which is a conductive polymeric monomer, 0.867 g of ferric toluenesulfonate which is an oxidizing agent, and 0.047 g of imidazole which is an oxidation stabilizer were mixed with the obtained silica sol solution to obtained a conductive organic/inorganic complex composition according to an embodiment of the present invention. The alcohol solvent used for obtaining the mixed solution is same as the one used for obtaining the silica sol solution.

A molar ratio of the conductive polymeric monomer and the oxidizing agent was 1:1.75, a molar ratio of the conductive polymeric monomer and the organosilicon compound was 1:1, and a molar ratio of the oxidizing agent and the oxidation stabilizer was 1.75:2, and a molar ratio of the organosilicon compound and the water was 1:8.

The obtained conductive organic/inorganic complex composition was spin coated and thermally polymerized at 130° C. for 1 hour. The thermally polymerized coating was washed with butanol and distilled water an dried at 130° C. for 30 minutes. The dried thin film had a conductivity of 2 S/cm. The dried thin film was exposed to UV light having a wavelength of 365 nm to decrease its conductivity to $1.8 \times 10^{-3}$ S/cm.

The resultant thin conductive organic/inorganic complex film was used as a hole injection layer and PFB was spin coated on the hole injection layer to form a hole transport layer having a thickness of 20 nm. A polyfluorene-based light-emitting material TS-9 was spin coated to form an emission layer with a thickness of 70 to 80 nm.

Subsequently, $BaF_2/Ca$ was vacuum deposited to a thickness of 5 nm on the emission layer and again vacuum deposited to a thickness of 3 nm to form a cathode. Then, Al was vacuum deposited to a thickness of 250 nm to manufacture an organic electroluminescent device according to an embodiment of the present invention

EXAMPLE 2

A thin conductive organic/inorganic complex film according to an embodiment of the present invention was formed using the same manner as in Example 1, except that a molar ratio of the conductive polymeric monomer and the organosilicon compound was 1:3. After the drying, the thin film had a conductivity of 0.9 S/cm. The dried thin film was exposed to UV light having a wavelength of 365 nm to decrease its conductivity to $4.3 \times 10^{-5}$ S/cm.

An organic electroluminescent device according to an embodiment of the present invention was manufactured in the same manner as in Example 1, except that the thin film obtained in Example 2 was uses as a hole injection layer.

Comparative Example 1

A conventional organic electroluminescent device was manufactured in the same manner as in Example 1, except that a hole injection layer was not used and an emission layer was formed on the ITO substrate.

Performance Test

Figure 4:
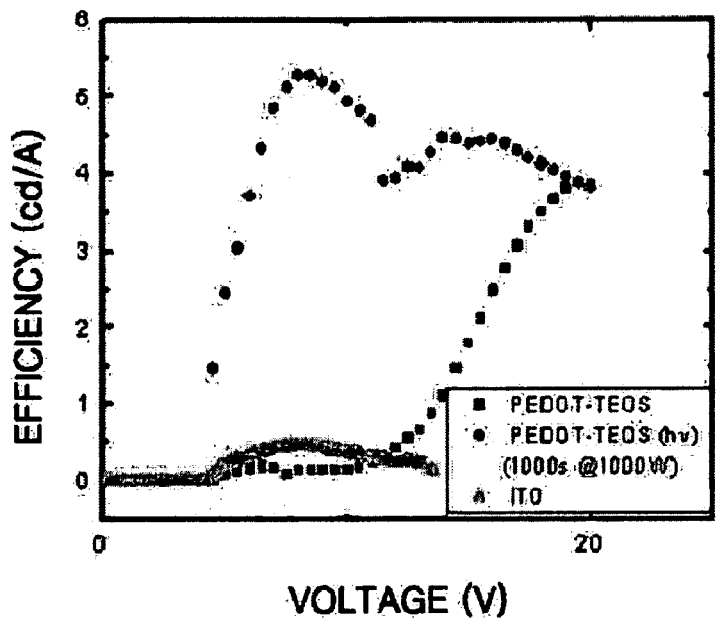
FIG. 4 is a graph of voltage vs. efficiency for an organic electroluminescent device manufactured in Example 1 and an organic electroluminescent device manufactured in Comparative Example 1.
Figure 5:
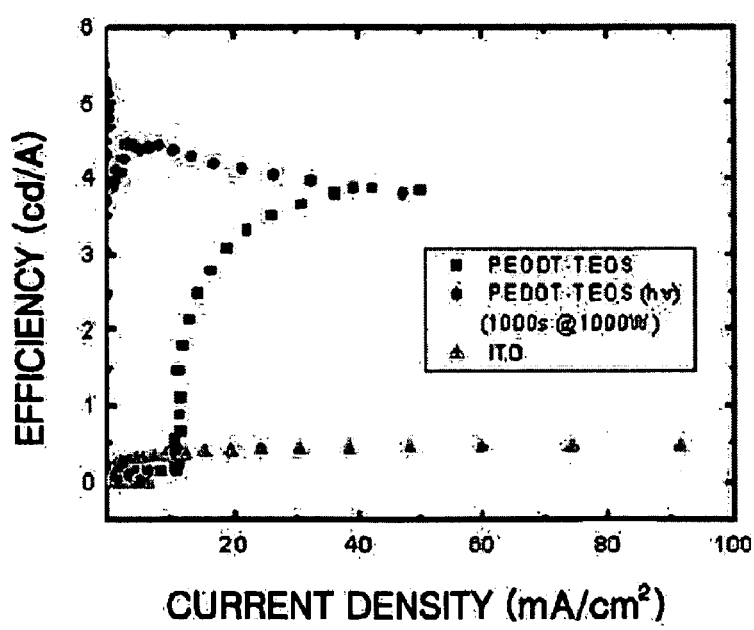
FIG. 5 is a graph of current density vs. efficiency for an organic electroluminescent device manufactured in Example 1 and an organic electroluminescent device manufactured in Comparative Example 1.

FIG. 4 is a graph of voltage vs. efficiency for an organic electroluminescent device manufactured in Example 1 and an organic electroluminescent device manufactured in Comparative Example 1. FIG. 5 is a graph of current density vs. efficiency for an organic electroluminescent device manufactured in Example 1 and an organic electroluminescent device manufactured in Comparative Example 1.

It was confirmed that the device manufactured in Example 1 using the thin conductive organic/inorganic complex film according to an embodiment of the present invention had more excellent emission characteristics than the device manufactured in Comparative Example 1.

According to the present invention, a conductive organic/inorganic complex composition which is hydrophobic and insoluble in water and an organic solvent, has a high mechanical strength, and is thermally and chemically stable, and of which compositional composition can be changed over a wide range, a method of preparing the composition, a thin conductive organic/inorganic complex film prepared using the composition, an organic electroluminescent device comprising the thin conductive organic/inorganic complex film, and a method of manufacturing the organic electroluminescent device are provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent device, comprising:
   a substrate;
   an anode on a substrate;
   a hole injection layer on the anode;
   a hole transport layer on the hole injection layer;
   an emission layer on the hole transport layer; and
   a cathode on the emission layer;
   wherein at least one of the anode, the hole injection layer, the hole transport layer and the cathode comprises a conductive organic/inorganic complex film formed from a conductive organic/inorganic complex composition, the conductive organic/inorganic complex composition comprising;
   a conductive polymeric monomer;
   an oxidizing agent;
   a first alcohol solvent; and
   a silica sol solution comprising an organosilicon compound, water, an acid catalyst, and a second alcohol solvent.

2. The organic electroluminescent device of claim 1, wherein the first alcohol solvent and the second alcohol solvent are the same.

3. The organic electroluminescent device of claim 1, wherein the conductive polymeric monomer include at least one compound selected from the group consisting of 3,4-ethylenedioxythiophen (EDOT), thiophen, aniline, pyrrole and a derivative thereof.

4. The organic electroluminescent device of claim 1, wherein the oxidizing agent include at least one compound selected from the group consisting of iron chloride ($FeCl_3$), iron perchlorate ($Fe(ClO_4)_3$), ferric toluenesulfonate, ferric dodecyl bezenesulfonate, ferric anthraquinone sulfonate, and ammonium persulfate.

5. The organic electroluminescent device of claim 1, wherein the organosilicon compound has formula 1:

$$SiR^1{}_xR^2{}_{4-x} \qquad (1)$$

wherein $R^1$ radicals are each independently a hydrogen atom, a fluorine atom, aryl, vinyl, allyl, or an unsubstituted or fluorine-substituted linear or branched C1-4 alkyl, $R^2$ radicals are each independently acetoxy, hydroxy, or a linear or branched C1-4 alkoxy, and x is an integer from 0 to 2.

6. The organic electroluminescent device of claim 1, wherein the acid catalyst include at least one compound selected from the group consisting of hydrochloric acid, sulfuric acid, nitric acid, phosphoric acid, hydrofluoric acid, formic acid, and acetic acid.

7. The organic electroluminescent device of claim 1, the first alcohol solvent and the second alcohol solvent include at least one compound selected from the group consisting of n-butanol, isopropanol, ethanol, and methanol.

8. The organic electroluminescent device of claim 1, further comprising at least one oxidation stabilizer selected from the group consisting of imidazole, dicyanohexylamine, and 1,8-diazabicyclo[5,4,0]undec-7-en (DBU).

9. The organic electroluminescent device of claim 1, wherein a molar ratio of the conductive polymeric monomer and the organosilicon compound is 1:0.01 to 1:100.

10. The organic electroluminescent device of claim 1, wherein a molar ratio of the conductive polymeric monomer and the oxidizing agent is 1:0.01 to 1:100.

11. The organic electroluminescent device of claim 1, wherein the concentration of the water in the silica sol solution is 0.5 to 100 mol per mol of silicon atom.

12. The organic electroluminescent device of claim 1, wherein the conductive organic/inorganic complex film is prepared by forming a coat of the conductive organic/inorganic complex composition and thermally polymerizing the coat.

13. The organic electroluminescent device of claim 12, wherein the thermal polymerization is performed at 0-200° C.

14. The organic electroluminescent device of claim 12, wherein the conductive organic/inorganic complex film has a conductivity of $10^{-8}$ to $10^5$ S/cm.

15. An organic electroluminescent device comprising:
   a conductive organic/inorganic complex film prepared by forming a coat of a conductive organic/inorganic complex composition and thermally polymerizing the coat, the conductive organic/inorganic complex composition comprising;
   a conductive polymeric monomer;
   an oxidizing agent;
   a first alcohol solvent; and
   a silica sol solution comprising an organosilicon compound, water, an acid catalyst, and a second alcohol solvent.

16. The organic electroluminescent device of claim 15, wherein at least one selected from the group consisting of an anode electrode, a hole injection layer, a hole transport layer, a charge transport layer, a charge injection layer, and a cathode electrode comprises the conductive organic/inorganic complex film.

17. A method of preparing an organic electroluminescent device, comprising:

forming an anode electrode on a substrate;
forming a hole injection layer on the anode electrode;
forming a hole transport layer on the hole injection layer;
forming an emission layer on the hole transport layer; and
forming a cathode electrode on the emission layer,
wherein at least one selected from the group consisting of the anode electrode, the hole injection layer, the hole transport layer, and the cathode electrode comprises a conductive organic/inorganic complex film prepared by coating a conductive organic/inorganic complex composition and thermally polymerizing the coating, the conductive organic/inorganic complex composition comprising a conductive polymeric monomer, an oxidizing agent, a first alcohol solvent, and a silica sol solution comprising an organosilicon compound, water, an acid catalyst, and a second alcohol solvent.

18. The method of claim 17, further comprising exposing the conductive organic/inorganic complex film to light to decrease a conductivity of the conductive organic/inorganic complex film.

19. A method of preparing an organic electroluminescent device, comprising:

preparing a conductive organic/inorganic complex composition, the preparation comprising:
obtaining a silica sol solution by mixing an organosilicon compound, water, an acid catalyst, and a first alcohol solvent; and
mixing the silica sol solution with a mixed solution comprising a conductive polymeric monomer, an oxidizing agent, and an second alcohol solvent;

forming a coat of the conductive organic/inorganic complex composition; and thermally polymerizing the coat.

20. The method of claim 19, wherein the first alcohol solvent and the second alcohol solvent are the same.

21. The method of claim 19, wherein the silica sol solution is obtained by reacting the organosilicon compound, the water, the acid catalyst, and the second alcohol solvent at 0 to 100° C.

* * * * *